April 5, 1966 W. SCHRÖDER 3,244,984

RADIO-OR TELEVISION RECEIVERS WITH FINDER TUNING

Filed Aug. 30, 1962

INVENTOR
WOLFGANG SCHRODER

BY [signature]
ATTORNEY

United States Patent Office 3,244,984

Patented Apr. 5, 1966

3,244,984

RADIO-OR TELEVISION RECEIVERS WITH FINDER TUNING

Wolfgang Schröder, Pforzheim, Germany, assignor to International Standard Electric Corporation, New York, N.Y., a corporation of Delaware Filed Aug. 30, 1962, Ser. No. 220,443
Claims priority, application Germany, Sept. 1, 1961, St 18,270
7 Claims. (Cl. 325—471)

The invention relates to radio or television receivers with finder tuning by means of an automatically stopped tuning motor when tuning on a carrier.

Arrangements are known for radio sets which make provision, e.g. after setting the tuning motor into operation, that the motor is stopped as soon as a carrier of a determined amplitude is received. Besides employed a relay to switch-off the aggregate driving the tuning component, amplifying components are required which amplify the characteristic signal being searched to an extent that a relay is energized.

An advantage of this invention is that already existing amplifier components (tubes or transistors) are used in a particular way to feed the switch-off relay, said components having another function during normal reception which, however, are not required for the tuning itself or which may even cause interferences. So, for example, the amplifier working on the loudspeaker of the radio or television receiver, would cause interfering noises during the automatic tuning and should in most cases be switched-off by special switching arrangements.

It is well-known that devices for automatic precision tuning in radio receivers, a motor setting the tuning is controlled by a trimming relay to let said trimming relay be directly controlled by the discriminator (cf. for example German Patent No. 1,049,932, 21*a*4, 29/01). According to the invention it is possible, however, to save further switching elements and relays and to feed even the relay winding and the motor itself from the plate current simultaneously.

It is further known to switch-off the loudspeaker, e.g. for quiescent tuning. According to another known signal-searching device, in order to set a preselected transmitter, a circuit modifying the amplification sensitivity of said device can be closed only if that switch has been operated which is coordinated to the respective transmitter.

The invention is—compared with the foregoing—characterized in this that the winding of a relay controlling the tuning motor and an interruptor (finder switch) are arranged in the output circuit of an amplifier switched to another circuit, in such a way that at switching-in the finder the relay winding is directly fed by the amplifier and the first circuit is set out of function by a relay contact and, at the same time, by another relay contact the control voltage of the AVC of the receiver or of the voltage from the audio-FM or tuning discriminator is applied to the input circuit of the amplifier.

Figure 1:
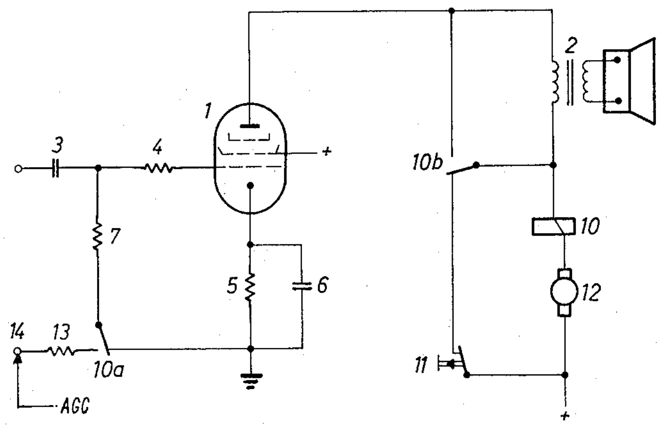
Figure 2:
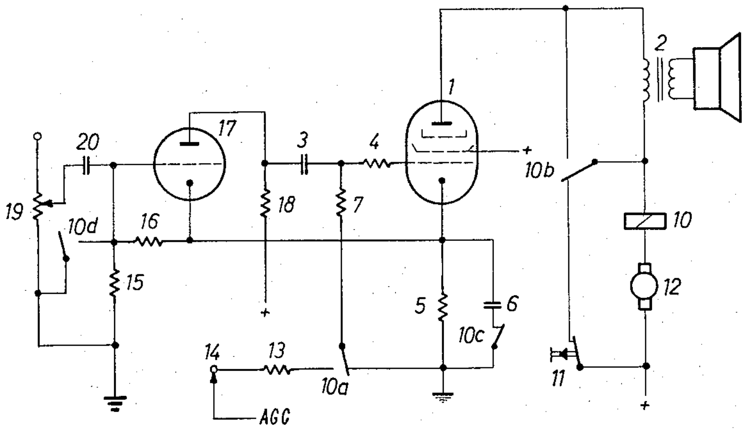

The invention will be more closely explained with the aid of the figures in which: FIG. 1 shows an arrangement according to my invention, and FIG. 2 shows another embodiment of the arrangement in FIG. 1.

Referring to FIG. 1, 1 is an output pentode operating on the loudspeaker 2. The pentode receives the audio-frequency at normal reception via coupling capacitor 3 and resistor 4. Resistor 5 and capacitor 6 form the RC-combination, necessary for obtaining the grid bias, and 7 is the grid-leak resistor connected to grounding.

The contacts 10*a* and 10*b* belong to relay 10 and are shown on the drawing in resting position at "no-current" relay winding, the circuitry being operated as a customary audio-output amplifier.

If the interrupter key 11 is pressed, the plate current of pentode 1 flows through the relay winding of relay 10, the change-over contact 10*b* cancels the short-circuit for the relay winding. Even if the key-contact closes again the relay remains energized. Contact 10*b* now short-circuits the output repeater for the loudspeaker in order to suppress interfering noise during the frequency tuning. The tuning commences because the plate current simultaneously flows through the tuning device motor motor 12. The control grid of the pentode is now connected to a source of automatic gain control (AGC) voltage at input 14 by resistors 4 and 7, and the relay contact 10*a* via decoupling resistor 13.

In a radio or television set, the control voltage of the AVC of the set can be introduced via input 14 which will become more negative as soon as the set is tuned on a receive carrier. In television sets a negative voltage may be introduced from the audio-FM-discriminator which even represents the distinct criterion for detecting a standard television carrier. Only if video and audio carrier are simultaneously "taken" during the tuning so that the normal intermodulation frequency for the audio-FM-discriminator is formed, the negative voltage necessary for the switch-off effect occurs. The tuning discriminator already existing in the set in most cases may also furnish the required switch-off voltage for the electronic precision tuning.

As soon as a negative voltage occurs at input 14 when a searched for carrier is detected, the pentode is blocked, relay 10 drops and remains in a short-circuit via contact 10*b*, the motor 12 is stopped and the tuning is completed. The circuitry again operates as an audio-output stage.

Variations of the circuitry result, if the loudspeaker including repeater is replaced by any resistor, for example, by the load resistor of a video-output stage, or also of a deflecting stage.

The motor 12 could be fed from another current source, whereby further relay contacts have to perform switching-on and -off the motor.

In order to achieve a quicker motor stop it may be short-circuited by an additional relay break-contact when stopping the motor or braked by a capacitor-counter discharge.

The key 11 may also be pressed over the receiver-remote control. The first pulling-up of the relay to obtain a physical decoupling, for example, may be achieved through a second winding at which the key furnishes the energizing current pulse working as a make-contact, either from the same or from another current source or from a capacitor charged via one or more high-ohmic resistors.

The cases in which the sensitivity of response and the unequivocal drop of the relay is not satisfactory according to the arrangement as shown in FIG. 1, the sensitivity of response and the reaction speed of the arrangement can essentially be increased by including another amplifier component already existing in most radio or television sets.

With a few and minor modifications the AF-preamplifier (class-B-amplifier) of the audio-stage can be used for example, if the audio-output stage as shown in FIG. 1, controls the relay current. Preamplification and output stage may be combined to a sensitive "flip-flop" which reacts with the desired sudden tilting-over into the other extreme position when reaching a defined threshold value of the discriminator or control voltage depending on the carrier. In order to combine both stages to a flip-flop a mutual coupling must be introduced connecting physically the output of the pre-stage with the input of the output stage and the output of the latter with the input of the pre-stage. In most cases, however, where the discriminator or control voltage determined by the wanted carrier will also be led physically to one of the two inputs a physical coupling may not be desirable. But it is mandatory if—as a substitute—a capacitive coupling wth sufficiently large time-constant is at hand under the condition that the relay armature dropping phase must be completed before the flip-flop, operating as a multivibrator, returns into its original position, after finding the desired carrier and initiating the first tilting-over and, consequently, the drop of the relay armature. Coupling may also be of the type combined from the capacitive, physical or repeater-type coupling, besides that kind of coupling.

FIG. 2 shows the very simple supplement to the arrangement according to FIG. 1. Function of the circuitry is exactly the same in its second stage with the pentode 1, so the same designation for the components was retained. There has been added only the pre-stage with the AF-triode 17 to the control grid of which the volume control 19 is connected via coupling capacitor 20. The cathode of the triode 17 is physically connected with the cathode of the pentode 1 and thus biased positively against the reference potential (grounding). The voltage divider with the resistors 15 and 16 provides the correct voltage between grid and cathode of the triode 17. The amplified voltage at the load resistor 18 reaches the grid of the pentode 1 via capacitor 3 and the anti-oscillation resistor 4. With the relay contacts as shown, the arrangement operates as normal AF-amplifier in which the introduced contact **10*c* is closed and connects the cathode capacitor 6 with ground, while contact 10*d* remains open. When the tuning process is initiated by pressing key 11 and the ensuing pullup of the relay armature 10 the triode grid will be grounded via contact 10*d* and the cathode capacitor 6 switched off the common cathode resistor 5 as contact 10*c* brakes. Thereby a physical coupling is achieved between the cathode output of the pentode stage and the cathode input of the pre-stage, while a capacitive coupling between the plate output of the pre-stage and the control-grid input of the pentode stage exists via capacitor 3. As long as the holding or retaining current flows through the pentode 1 after the relay has pulled up, the arrangement is in tuning condition as per FIG. 1. As soon as the carrier has been found, the negative discriminator or control voltage occurring at the control grid of the pentode initiates the synchronous coupling because the more heavily dropping pentode current causes a rise of the triode current, and the triode grid becomes positively charged. The thereby decreasing plate current of the triode causes a further potential drop and the control grid of the pentode, via the recharging capacitor 3: the synchronous coupling circuit is closed and a very accurate release of the relay is achieved. After the relay has dropped, the tuning is finished and, the set is tuned to the desired carrier, with the flip-flop again in a normal audio-amplfiier function. In particular cases it would be possible, instead of the negative switchover voltage hitherto assumed and which can be derived from the variable control, the audio-FM, or the tuning discriminator, voltage is available which becomes more and more positive. It is then possible without difficulties to lead the voltage to the grid of the triode 17** with the same effect.

Since synchronous coupling is primarily achieved by the phase inversion of the initiating signal pulse by means of a second amplifier stage and the return of the signal to the first stage, the second amplifier stage may be replaced by a phase-inverting transformer. It would be economical to use already existing components, such as output repeaters or deflecting transformers. But, it is important to consider the already mentioned requirement of the de-energizing period of the relay and the time-constants of the circuitry.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. A radio receiver having automatic tuning means comprising:
- a first amplifier tube;
- a second amplifier tube;
- tuning driving means;
- capacitive coupling means for a normal operation and tuning between the plate output of said first amplifier tube and the control grid of said second amplifier tube, said means coupling said first and second tubes as an audio-amplifier and an amplifier tube respectively;
- switching means for coupling at least one of said tubes to drive said tuning driving means and for coupling the cathode output of said second amplifier tube to the cathode input of said first amplifier tube to form a triggering circuit during tuning; and
- means for applying an incoming signal to one of said tubes to return said tubes to normal operation.

2. A radio receiver according to claim 1 further comprising a source of automatic gain control voltage wherein said means for applying an incoming signal to one of said tubes comprises means for applying said automatic gain control voltage to the control grid of said second amplifier tube during tuning.

3. A radio receiver according to claim 2 further comprising a loud speaker connected to said second amplifier tube during normal operation and wherein said switching means includes means for disconnecting said loudspeaker from said second amplifier tube during turning.

4. A radio receiver according to claim 3 wherein said switching means comprises a relay for effecting the various connections and disconnections and wherein the winding of said relay is in the plate circuit of said second amplifier tube during tuning.

5. A radio receiver according to claim 4 wherein said tuning driving means comprises a tuning motor and said switching means further comprises means for placing the winding of said tuning motor in the plate circuit of said second amplifier tube during tuning.

6. A radio receiver according to claim 5 wherein said switching means further comprises means for disconnecting said tuning motor and said relay winding from said second amplifier tube during normal operation.

7. A radio receiver according to claim 6 further comprising pushbutton means for effecting automatic tuning whereby said pushbutton means is capable of switching said radio receiver from normal operation to tuning.

References Cited by the Examiner

UNITED STATES PATENTS

| | | | |
|---|---|---|---|
| 2,035,612 | 3/1936 | Liebreich | 325—471 X |
| 2,516,856 | 8/1950 | Cowles | 325—471 X |
| 2,569,426 | 9/1951 | O'Brien | 325—471 X |
| 2,843,734 | 7/1958 | Lerch et al. | 325—470 |
| 3,020,402 | 2/1962 | Brodsky et al. | 325—470 |

ROBERT H. ROSE, *Primary Examiner.*

DAVID G. REDINBAUGH, *Examiner.*

R. F. ROTELLA, R. LINN, *Assistant Examiners.*